United States Patent [19]
Chen et al.

[11] Patent Number: 5,472,896
[45] Date of Patent: Dec. 5, 1995

[54] METHOD FOR FABRICATING POLYCIDE GATE MOSFET DEVICES

[75] Inventors: Anchor Chen, Taichung; Gary Hong, Hsinchu, both of Taiwan

[73] Assignee: United Microelectronics Corp., Hsinchu, Taiwan

[21] Appl. No.: 338,951

[22] Filed: Nov. 14, 1994

[51] Int. Cl.$^6$ .................... H01L 21/336; H01L 21/28
[52] U.S. Cl. ...................... 437/44; 437/192; 437/200
[58] Field of Search ................... 437/41, 44, 192, 437/200, 193

[56] References Cited

U.S. PATENT DOCUMENTS

| | | | |
|---|---|---|---|
| 4,356,623 | 11/1982 | Hunter | 437/44 |
| 4,683,645 | 8/1987 | Naguib et al. | 437/41 |
| 4,777,150 | 10/1988 | Deneuville et al. | 437/192 |
| 4,782,033 | 11/1988 | Gierisch et al. | 437/200 |
| 4,788,160 | 11/1988 | Havemann | 437/200 |
| 4,859,278 | 8/1989 | Choi | 156/643 |
| 4,897,368 | 1/1990 | Kobushi et al. | 437/192 |
| 4,935,380 | 6/1990 | Okumura | 437/44 |
| 5,013,686 | 5/1991 | Choi et al. | 437/200 |
| 5,028,554 | 7/1991 | Kita | 437/44 |
| 5,089,432 | 2/1992 | Yoo | 437/44 |
| 5,130,266 | 7/1992 | Huang et al. | 437/44 |
| 5,234,850 | 8/1993 | Liao | 437/44 |
| 5,340,761 | 8/1994 | Loh et al. | 437/192 |
| 5,393,685 | 2/1995 | Yoo et al. | 437/44 |

Primary Examiner—Mary Wilczewski
Attorney, Agent, or Firm—Ladas & Parry

[57] ABSTRACT

A method of fabricating MOSFET device with polycide gate, which includes a polysilicon layer and a refractory metal silicide layer, is described. After a thin oxide layer is formed by a thermal process, the refractory metal silicide layer is transformed from an amorphous form to a crystalline form that leads to peeling and surface roughness problems in the prior art. This method utilizes an additional ion implantation step to transform the refractory metal silicide layer from the crystalline form back into the amorphous form. Hence, the problems of peeling and surface roughness of the polycide gate can be overcome.

4 Claims, 7 Drawing Sheets

METHOD FOR FABRICATING POLYCIDE GATE MOSFET DEVICES

BACKGROUND OF THE INVENTION

1. Field of the Invention

This invention relates in general to the fabrication of integrated circuit (IC) devices, and more particularly to a method for fabricating polycide gate MOSFET devices that prevent problems of peeling and surface roughness of the polycide by performing an additional ion implantation step.

2. Description of the Prior Art

The current trend in VLSI design toward denser and more complex circuitry produces closely spaced and smaller geometries on larger chips, which result in narrower and longer interconnect lines. In the past, polysilicon was a satisfactory material for use as the gate electrodes and the interconnecting lines. However, as these geometries become smaller, polysilicon is too high in resistivity for these applications and it starts having too big of an impact on RC time delays and IR voltage drops. The use of a combination of refractory metal silicides with polysilicon, referred to as polycide, has proven suitable for VLSI fabrication because of its lower resistivity.

Silicides of certain refractory metals, e.g. tungsten, molybdenum, titanium, and tantalum have been proven to be suitable for use as a low resistance interconnect material for VLSI integrated circuit fabrication. These silicides pair very well with heavily doped polysilicon to form polycide gates. The preferred deposition technique for refractory metal silicides is by low pressure chemical vapor deposition (LPCVD). Tungsten silicide has particularly been found to be capable of overcoming some shortcomings, such as stoichiometry control, surface roughness, adhesion, oxidation and reproducibility to be very useful in combination with polysilicon.

The as-deposited tungsten disilicide has an amorphous structure ($WSi_x$) and crystallizes into hexagonal tungsten disilicide ($WSi_2$) when it is annealed around 450° C. After annealing at temperatures higher than 650° C., the hexagonal phase will transform into a tetragonal phase. During thermal treatment of a silicon wafer, such as is done in forming a layer of oxide, part of silicon in the tungsten disilicide precipitates at the disilicide/polysilicon interface or reacts with the oxygen ambient to form silicon dioxide. Therefore, a higher silicon concentration in the tungsten silicide is necessary to provide excess silicon during high temperature oxidation, to maintain tungsten silicide stoichiometry, and to improve silicide adhesion to the polysilicon layer.

However, it is also a fact that peeling of this polycide film frequently occurs after a thermal treatment. This, in turn, causes the yield of the product to decrease. With reference to FIGS. 1a to 1f, the process steps of a prior art MOSFET device having a polycide gate is now described.

Referring to FIG. 1a, there is shown a semiconductor substrate 10, such as a p type monocrystalline silicon substrate. A gate oxide layer 12 with thickness between 100 Å to 400 Å, and preferably such as 250 Å, is formed over the semiconductor substrate 10, preferably by thermal oxidation. A polysilicon layer 14 with thickness of between 1000 Å to 4000 Å, and preferably such as 2000 Å, is formed over the gate oxide layer 12 preferably by deposition, such as by LPCVD. The polysilicon layer 14 is implanted with phosphorous ions with a dosage over $1 \times 10^{15}$ atoms/cm$^2$ so as to provide a sufficient concentration of carriers. The resulting surface is then cleaned by dipping in a dilute HF solution. An amorphous tungsten silicide layer 16 with thickness of between 500 Å to 4000 Å, and preferably such as 2500 Å, is formed over the polysilicon layer 14 preferably by LPCVD.

Turning now to FIG. 1b, a photoresist layer (not shown) is coated and patterned on the tungsten silicide layer 16 by a conventional lithography process. Portions of the tungsten silicide layer 16 and the polysilicon layer 14 not covered by the photoresist layer are removed by anisotropic etching, such as by reactive ion etching (RIE), to define a gate electrode structure. The photoresist layer is then removed by an appropriate solvent.

Referring to FIG. 1c, a first thin oxide layer 18 with thickness of between 300 Å to 500 Å is formed over the exposed surfaces of the gate oxide layer 12, the polysilicon layer 14, the tungsten silicide layer 16, and the semiconductor substrate 10 by thermal oxidation. Meanwhile, the tungsten silicide layer 16 is transformed from the amorphous form into a crystalline form (i.e. $WSi_x \rightarrow WSi_2$). Next, by using the gate electrode structure as a mask, n type impurities, such as phosphorous ions with an energy preferably between 30 to 70 KeV and with dose preferably between $1 \times 10^{12}$ to $1 \times 10^{14}$ atoms/cm$^2$, are implanted into the semiconductor substrate 10 to form n⁻ lightly doped source/drain regions 13.

Please now turn to FIG. 1d. An oxide layer 20 with thickness of between 1000 Å to 4000 Å, and preferably such as 2400 Å, is formed over the first thin oxide layer 18 preferably by CVD. The oxide layer 20 is densified in nitrogen ambient at temperature of about 900° C. Then, the oxide layer 20 and the first thin oxide layer 18 are anisotropically etched back, such as by RIE, to form sidewall spacers 20 on the side walls of the gate electrode structure, as is shown in FIG. 1e.

Referring to FIG. 1f, a second thin oxide layer 22 with thickness of between 300 Å to 500 Å is formed over the exposed surfaces of the gate electrode structure, and the semiconductor substrate 10 by thermal oxidation. Peeling of the tungsten silicide 16 is apt to occur after this thermal treatment and the tungsten silicide layer 16 is shown having peeled away from polysilicon layer 14 in this figure. As a result of this peeling, increasing particles and decreasing yield.

There are mainly two steps which cause the tungsten silicide to peel. First, the tungsten silicide layer 16 is damaged by the previous etching process, such as sidewall spacer etching, resulting in less content of silicon in tungsten silicide. Second, after the thermal treatment, the tungsten silicide layer 16 transforms from its amorphous form into a crystalline which increases the stress in layer 16 and the added stress adversely affects the layer's adhesion properties.

In order to avoid the etching damage, a prior art method has been proposed which applies a barrier cap layer 30, such as a polysilicon layer, over the tungsten silicide layer 16, as is shown in FIG. 2. However, after defining the gate electrode structure by RIE, sidewall portions of the tungsten silicide layer 16 are exposed. When a thin oxide layer is formed by a thermal treatment, the exposed portions of the tungsten silicide layer 16 will roughen at its exposed surface, which is referred to as "popcorn phenomenon", resulting particle contamination and device failure.

SUMMARY OF THE INVENTION

The present invention provides a method of fabricating integrated circuits which overcomes the problem of peeling of the polycide film by reducing the stress therein, so as to raise the yield of the product.

The present invention, in another aspect, provides a method for fabricating integrated circuits which overcomes the problem of surface roughness of the tungsten silicide, or popcorn issue in tungsten silicide side walls by reducing the stress therein, so as to raise the yield of the product.

This invention provides a method for fabricating polycide gate MOSFET devices. This method comprises the steps of: forming a gate electrode structure on the semiconductor substrate which structure includes a gate oxide layer, a polysilicon gate layer, and a refractory metal silicide layer; forming a first thin thermal oxide layer over the exposed surfaces of the gate electrode structure and the semiconductor substrate, wherein the refractory metal silicide layer being transformed from its amorphous form into its crystalline form simultaneously; forming lightly doped source/drain regions in the semiconductor substrate by a first ion implantation using the gate electrode structure as a mask; forming a dielectric layer over the first thin thermal oxide layer; anisotropically etching the dielectric layer and the first thin thermal oxide layer to form sidewall spacers on the side walls of the gate electrode structure; transforming the refractory metal silicide layer from its crystalline form into its amorphous form by a second ion implantation; forming a second thin thermal oxide layer over the exposed surfaces of the gate electrode structure, and the semiconductor substrate; and forming heavily doped source/drain regions in the semiconductor substrate by a third ion implantation using the gate electrode structure and the sidewall spacers as a mask, completing the metal oxide semiconductor field effect transistor device.

This invention also provides a method for fabricating polycide gate MOSFET devices is provided. This method comprises the steps of: sequentially forming a gate oxide layer, a polysilicon gate layer, and a refractory metal silicide layer over the semiconductor substrate; forming a barrier cap layer over the refractory metal silicide layer, wherein the refractory metal silicide layer being transformed from its amorphous form into its crystalline form simultaneously; selectively etching the barrier cap layer, the refractory metal silicide layer, the polysilicon gate layer, and the gate oxide layer to form a gate electrode structure; transforming sidewall portions of the refractory metal silicide layer from its crystalline form into its amorphous form by a first ion implantation which is tiled an angle to the rotated wafer; forming a first thin thermal oxide layer over the exposed surfaces of the gate electrode structure and the semiconductor substrate; forming lightly doped source/drain regions in the semiconductor substrate by a second ion implantation using the gate electrode structure as a mask; forming a dielectric layer over the first thin thermal oxide layer; anisotropically etching the dielectric layer and the first thin thermal oxide layer to form sidewall spacers on the side walls of the gate electrode structure; forming a second thin thermal oxide layer over the exposed surfaces of the gate electrode structure, and the semiconductor substrate; and forming heavily doped source/drain regions in the semiconductor substrate by a third ion implantation using the gate electrode structure and the sidewall spacers as a mask, completing the metal oxide semiconductor field effect transistor device.

BRIEF DESCRIPTION OF THE DRAWINGS

The present invention will more fully understood from the detailed description provided hereinafter with reference to the accompanying drawings which are given by way of illustration only, and thus not limitative of the present invention and wherein.

DETAILED DESCRIPTION OF THE PREFERRED EMBODIMENTS

Figure 1A:
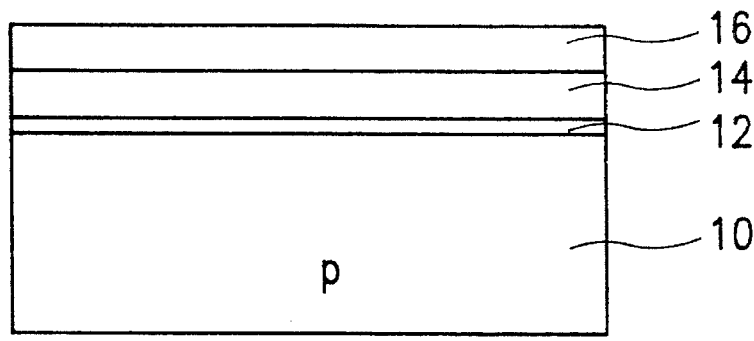
FIGS. 1a to 1f are cross sectional views illustrating the process steps of a prior art method for fabricating polycide gate MOSFET device.
Figure 1B:
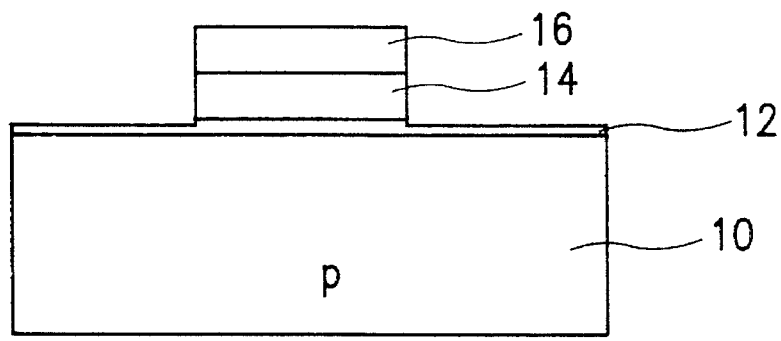
Figure 1C:
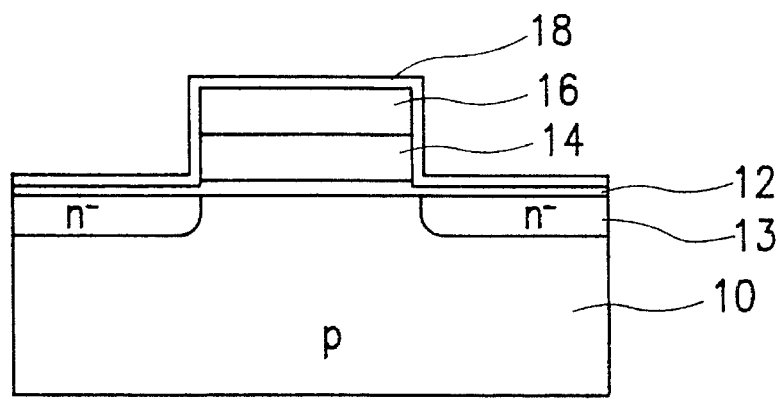
Figure 1D:
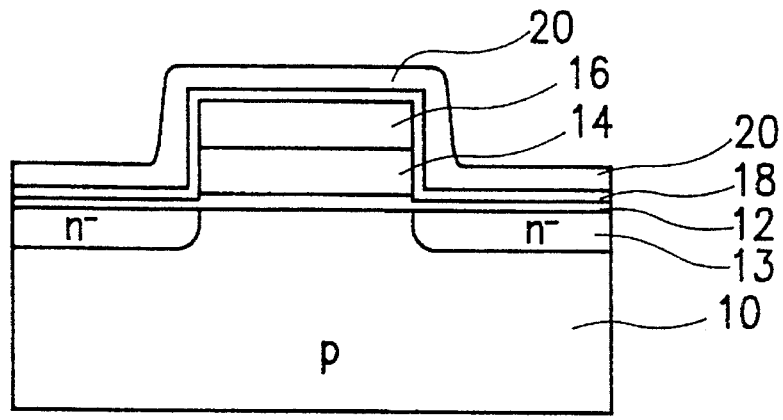
Figure 1E:
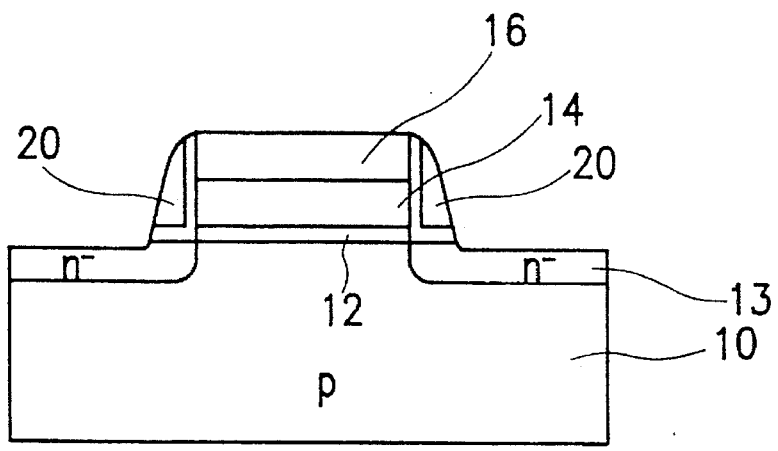
Figure 1F:
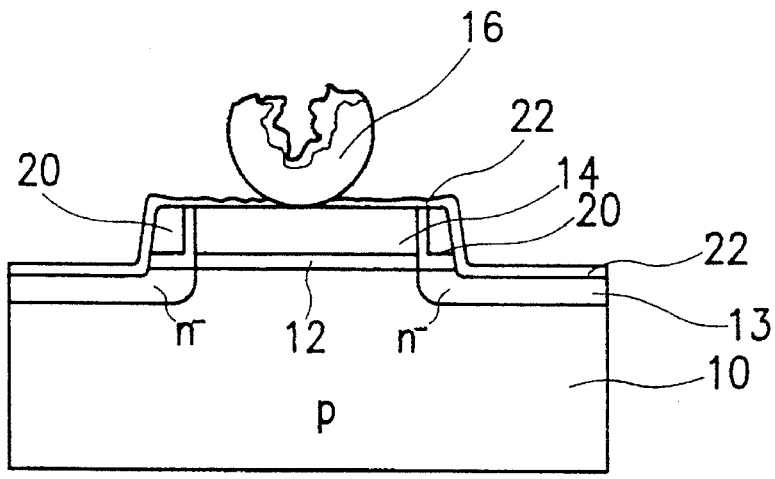
Figure 2:
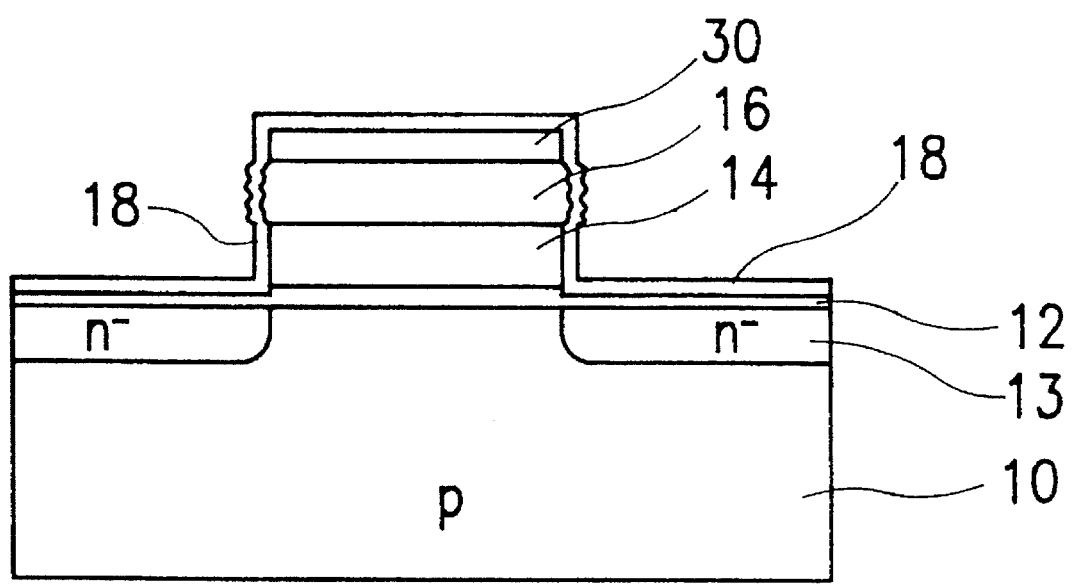
FIG. 2 illustrates in cross sectional view another prior art polycide gate MOSFET device.

One preferred embodiment of the method for fabricating polycide gate MOSFET device according to the present invention is now described in detail with reference to FIGS. 3a to 3f. Many of the steps which are described with reference to FIGS. 1a to 1f are also used in this embodiment and therefore like numbers are used in the drawings for refer to like processing steps and resulting structures.

Referring to FIG. 3a to 3e, the gate electrode structure including a gate oxide layer 12, a polysilicon layer 14, and a tungsten silicide layer 16, the first thin oxide layer 18, the n⁻ lightly doped source/drain regions 13, and the sidewall spacers 20 are formed on the semiconductor substrate 10 preferably by the same process steps as have been already described with reference to FIGS. 1a to 1e. However, an additional ion implantation step is performed after the sidewall spacers 20 are formed. In this embodiment, heavy ions, such as argon or arsenic ions, are implanted into the substrate to transform the tungsten silicide layer 16 from its crystalline form back into the amorphous form (i.e. $WSi_2 \rightarrow WSi_x$). As a result, the stress in the tungsten silicide layer 16 is apparently reduced in the following thermal oxidation step.

Figure 3A:
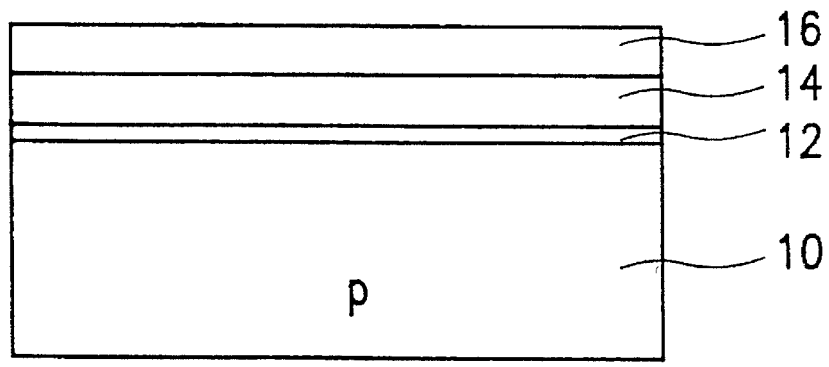
FIGS. 3a to 3f are cross sectional views illustrating the process steps of one preferred embodiment of the method for fabricating polycide gate MOSFET device according to the present invention.
Figure 3B:
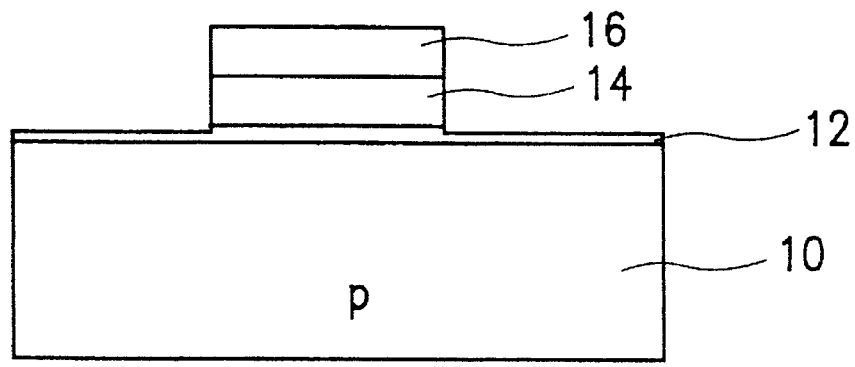
Figure 3C:
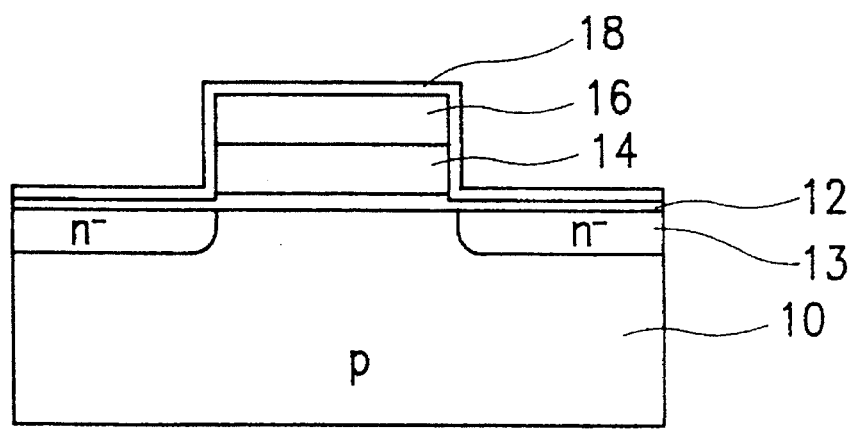
Figure 3D:
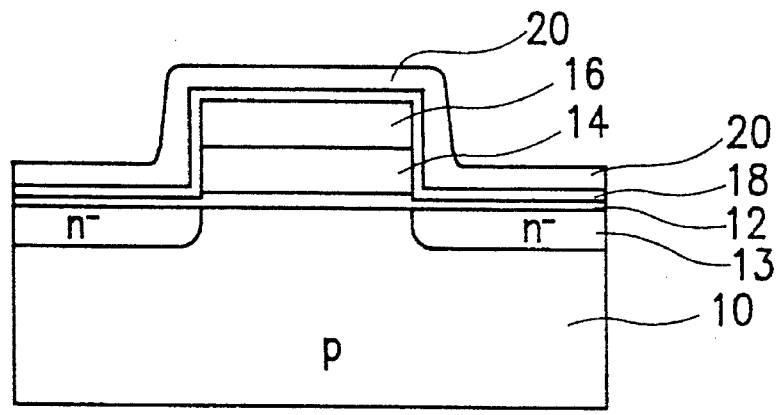
Figure 3E:
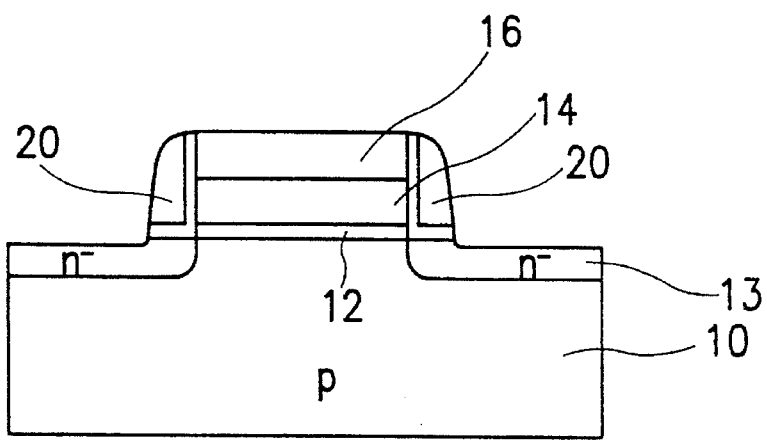
Figure 3F:
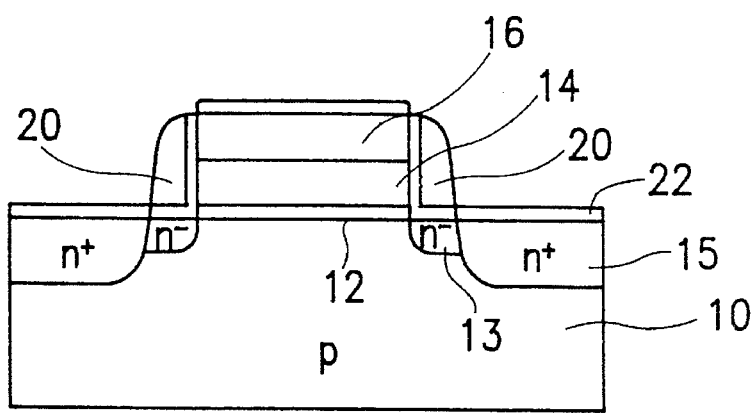

Turning to FIG. 3f, a second thin oxide layer 22 with thickness of between 300 Å to 500 Å is formed over the exposed surfaces of the gate electrode structure, and the semiconductor substrate 10, preferably by conventional thermal oxidation. The peeling of the tungsten silicide layer 16 is prevented, due to the additional ion implantation step described above. Finally, by using the gate electrode structure and the sidewall spacers as a mask, n type impurities, such as arsenic ions with energy of between 40 to 100 KeV and with dose of between $1\times10^{15}$ to $1\times10^{16}$ atoms/cm², are implanted into the semiconductor substrate 10 to form n⁺ heavily doped source/drain regions 15.

Another preferred embodiment of the method for fabricating polycide gate MOSFET device according to the present invention is now described in detail with reference to FIGS. 4a to 4f. As in the case of the previously described embodiment, many of the steps which are described with reference to FIGS. 1a to 1f are also used in this embodiment and therefore like numbers are used in the drawings for refer to like processing steps and resulting structures.

Figure 4A:
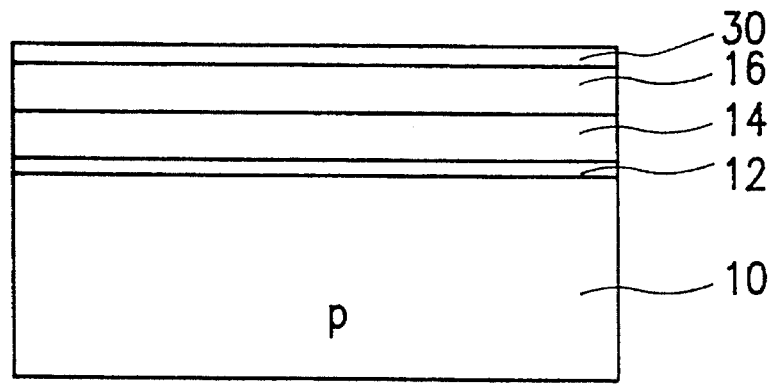
FIGS. 4a to 4f are cross sectional views illustrating the process steps of another preferred embodiment of the method for fabricating polycide gate MOSFET device according to the present invention.

Referring to FIG. 4a, there is shown a semiconductor substrate 10, such as a p type monocrystalline silicon substrate. A gate oxide layer 12, a polysilicon gate layer 14, and a tungsten silicide layer 16 are sequentially formed over the semiconductor substrate 10 preferably by the same process steps described with reference FIG. 1a. A barrier cap layer 30, such as a polysilicon layer, is formed over the tungsten silicide layer 16 preferably by CVD. Meanwhile, due to the thermal treatment of the CVD process, the tungsten silicide layer 16 is transformed from the amorphous form into a crystalline form (i.e. $WSi_x \rightarrow WSi_2$).

Figure 4B:
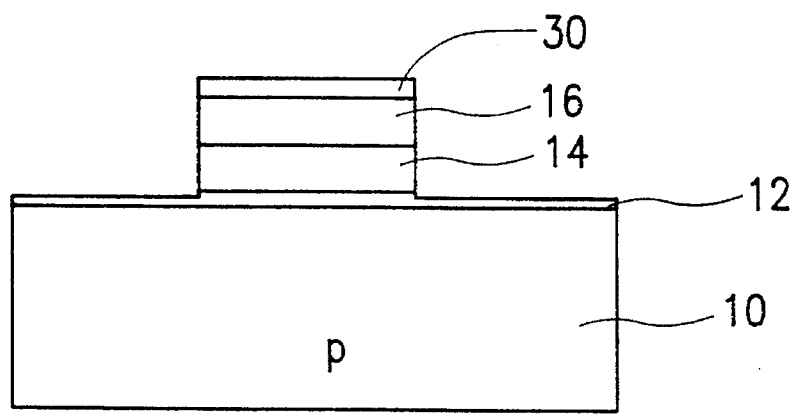

Turning now to FIG. 4b, a photoresist layer (not shown) is coated and patterned on the barrier cap layer 30 by conventional lithography processing. Portions of the barrier cap layer 30, the tungsten silicide layer 16 and the polysilicon layer 14 not covered by the photoresist layer are removed by anisotropic etching, such as reactive ion etching (RIE), to form a gate electrode structure. The photoresist layer is then removed by an appropriate solvent. Next, an ion implantation step is performed after the gate electrode structure formation. In this preferred embodiment, heavy ions such as argon or arsenic ions are implanted into the sidewall portions of tungsten silicide 16 by tilting an angle and rotating the substrate to transform sidewall portions of the tungsten silicide layer 16 from the crystalline form back into the amorphous form (i.e. $WSi_2 \rightarrow WSi_x$). Hence, the stress in the tungsten silicide layer 16 can be reduced in the following thermal oxidation step.

Figure 4C:
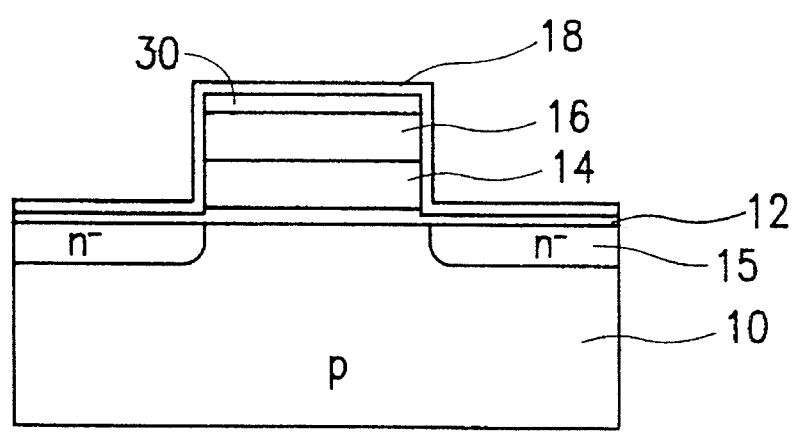

Referring to FIG. 4c, a first thin oxide layer 18 with thickness of between 300 Å to 500 Å is formed over the exposed surfaces of the gate electrode structure and the semiconductor substrate 10 preferably by thermal oxidation. The "popcorn phenomenon" in the sidewall portions of the tungsten silicide layer 16 is prevented due to the above described ion implantation step. Next, by using the gate electrode structure as a mask, n type impurities, such as phosphorous ions with energy of between 30 to 70 KeV and with dose of between $1 \times 10^{12}$ to $1 \times 10^{14}$ atoms/cm$^2$, are implanted into the semiconductor substrate 10 to form n$^-$ lightly doped source/drain regions 13.

Figure 4D:
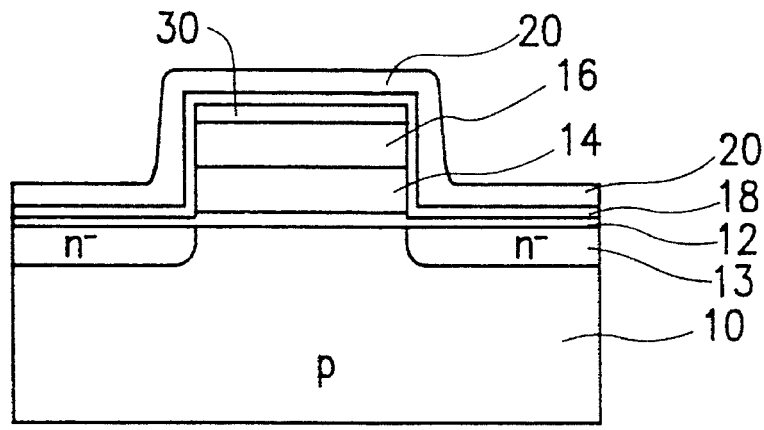
Figure 4E:
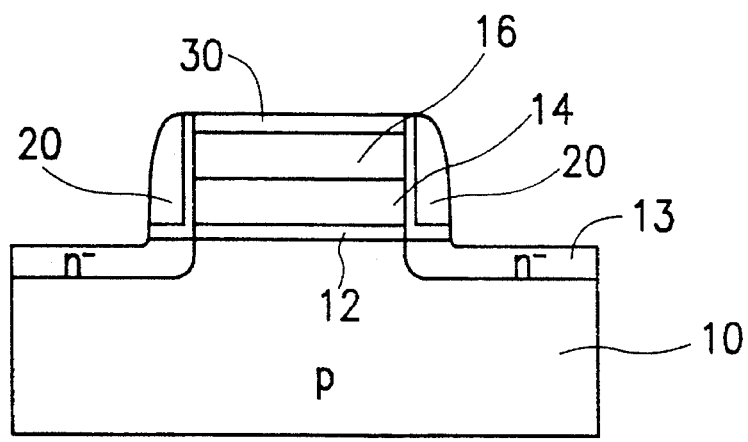

As is depicted in FIG. 4d, an oxide layer 20, with thickness of between 1000 Å to 4000 Å, and preferably such as 2400 Å, is formed over the first thin oxide layer 18, preferably by CVD. The oxide layer 20 is densified in a nitrogen ambient at a temperature of about 900° C. Then, the oxide layer 20 and the first thin oxide layer 18 are anisotropically etched back, such as by RIE, to form sidewall spacers 20 on the side walls of the gate electrode structure, as is shown in FIG. 4e.

Figure 4F:
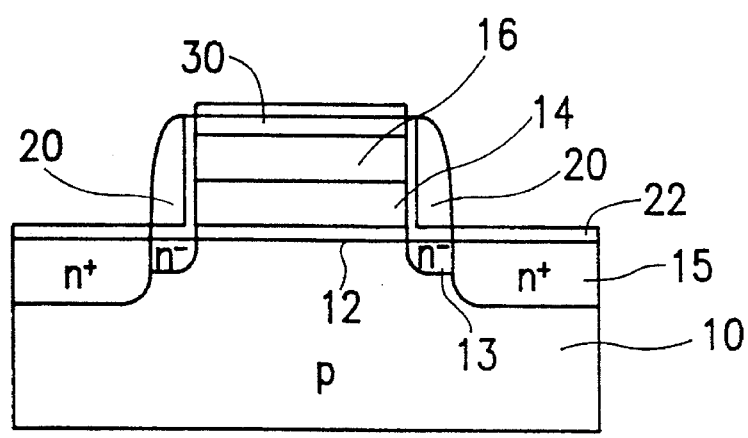

Referring to FIG. 4f, a second thin oxide layer 22 with thickness of between 300 Å to 500 Å is formed over the exposed surfaces of the gate electrode structure, and the semiconductor substrate 10 by conventional thermal oxidation. Finally, by using the gate electrode structure and the sidewall spacers as a mask, n type impurities, such as arsenic ions with energy preferably between 40 to 100 KeV and with dose preferably between $1 \times 10^{15}$ to $1 \times 10^{16}$ atoms/cm$^2$, are implanted into the semiconductor substrate 10 to form n$^+$ heavily doped source/drain regions 15.

While the invention has been described by way of examples and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating metal oxide semiconductor field effect transistor device on a semiconductor substrate, comprising the steps of:

forming a gate electrode structure on said semiconductor substrate which structure includes a gate oxide layer, a polysilicon gate layer, and a refractory metal silicide layer;

forming a first thin thermal oxide layer over the exposed surfaces of said gate electrode structure and said semiconductor substrate, said refractory metal silicide layer being transformed from its amorphous form into a crystalline form;

forming lightly doped source/drain regions in said semiconductor substrate by a first ion implantation procedure using said gate electrode structure as a mask;

forming a dielectric layer over said first thin thermal oxide layer;

anisotropically etching said dielectric layer and said first thin thermal oxide layer to form sidewall spacers on the side walls of said gate electrode structure;

transforming said refractory metal silicide layer from its crystalline form into its amorphous form by a second ion implantation procedure;

forming a second thin thermal oxide layer over the exposed surfaces of said gate electrode structure, and said semiconductor substrate; and forming heavily doped source/drain regions in said semiconductor substrate by a third ion implantation procedure using said gate electrode structure and said sidewall spacers as a mask.

2. The method for fabricating metal oxide semiconductor field effect transistor device of claim 1, wherein said refractory metal silicide layer comprises tungsten silicide.

3. The method for fabricating metal oxide semiconductor field effect transistor device of claim 1, wherein said second ion implantation is performed using arsenic ions.

4. The method for fabricating metal oxide semiconductor field effect transistor device of claim 1, wherein said second ion implantation is performed using argon.

* * * * *